United States Patent [19]
Kirihata et al.

[11] Patent Number: 5,978,931
[45] Date of Patent: Nov. 2, 1999

[54] VARIABLE DOMAIN REDUNDANCY REPLACEMENT CONFIGURATION FOR A MEMORY DEVICE

[75] Inventors: Toshiaki Kirihata, Poughkeepsie; Garbiel Daniel, Jamaica Estates, both of N.Y.; Jean-Marc Dortu, S. Burlington, Vt.; Karl-Peter Pfefferl, Hohenkirchen, Germany

[73] Assignees: International Business Machines Corporation, Armonk, N.J.; Siemens Aktiengesellschaft, Munich, Germany

[21] Appl. No.: 08/895,061

[22] Filed: Jul. 16, 1997

[51] Int. Cl.⁶ ..................................... G11C 7/00
[52] U.S. Cl. .......................... 714/7; 714/5; 714/6; 714/11
[58] Field of Search ................. 365/200, 96; 371/40.11, 371/10.2, 10.3; 395/182.05, 182.04, 182.03, 182.01, 183.18, 200.44, 200.45, 200.51, 842, 848

[56] References Cited

U.S. PATENT DOCUMENTS

| | | | |
|---|---|---|---|
| 5,295,101 | 3/1994 | Stephen et al. | 365/200 |
| 5,357,612 | 10/1994 | Alaiwan | 395/200 |
| 5,430,679 | 7/1995 | Hiltebeitel et al. | 365/200 |
| 5,459,690 | 10/1995 | Rieger et al. | 365/200 |
| 5,461,587 | 10/1995 | Oh | 365/200 |
| 5,475,648 | 12/1995 | Fujiwara | 365/230.06 |
| 5,491,664 | 2/1996 | Phelan | 365/200 |
| 5,691,945 | 11/1997 | Liou et al. | 365/200 |
| 5,703,817 | 12/1997 | Shiratake et al. | 365/200 |
| 5,724,295 | 3/1998 | Beiley et al. | 365/222 |
| 5,831,913 | 11/1998 | Kirihata | 365/200 |
| 5,831,914 | 11/1998 | Kirihata | 365/200 |

OTHER PUBLICATIONS

H. L. Kalter, et al, "A 50–ns 16–Mb DRAM with a 10–ns Data Rate and O–Chip ECC" IEEE Journal of Solid–State Circuits, V. 25, Oct. 1990, pp. 1118–1128.

T. Kirihata, et al, "A 14–ns 4–Mb CMOS DRAM with 300–mW Active Power" IEEE Journal of Solid–State Circuits, V. 27, Sep. 1992, pp. 1222–1228.

T. Sugibayashi, et al, "A 30ns 256Mb DTAM with Multi-–Divided Array Structure" IEEE Journal of Solid–State Circuits, V. 28, Nov. 1993, pp. 1092–1098.

T. Kirihata, et al, "Fault–Tolerant Designs for 256 Mb DRAM" IEEE Journal of Solid–State Circuits, V. 31, Apr. 1996, pp. 558–566.

*Primary Examiner*—Robert W. Beausoliel, Jr.
*Assistant Examiner*—Andy Nguyen
*Attorney, Agent, or Firm*—H. Daniel Schnurmann

[57] ABSTRACT

A fault-tolerant memory device provided with a variable domain redundancy replacement (VDRR) arrangement is described. The memory device includes: a plurality of primary memory arrays; a plurality of domains having at least portions of one domain common to another domain to form an overlapped domain area, and at least one of the domains overlapping portions of at least two of the primary memory arrays; redundancy units, coupled to each of the domains, for replacing faults contained within each of the domains; control circuitry for directing at least one of the faults within one of the domains to be replaced with the redundancy units, wherein at least one other fault of the one domain is replaced by the redundancy unit coupled to another of the domains, if the at least one other fault is positioned within the overlapped domain area. Each redundancy unit supporting the primary memory arrays includes a plurality of redundant elements. Unlike the conventional fixed domain redundancy replacement scheme, RUs are assigned to at least two variable domains, wherein at least a portion of the domain is common to that of another domain. The VDRR makes it possible to choose the most effective domain, and in particular, a smaller domain for repairing a random fault or a larger domain for repairing a clustered faults.

26 Claims, 10 Drawing Sheets

○ GOOD ELEMENT (GOOD REDUNDANCY ELEMENT RE)
✗ DEFECTIVE ELEMENT
⎛ UNIT: ELEMENTS REPLACED WITH REDUNDANCY UNIT (RU CONTAING 2REs) SIMULTANEOUSLY
⎝

VARIABLE DOMAIN REDUNDANCY REPLACEMENT CONFIGURATION FOR A MEMORY DEVICE

RELATED APPLICATION

This application is related to U.S. patent application Ser. No. 08/895,249, filed Jul. 16, 1997 now U.S. Pat. No. 5,881,003, entitled "Method of Making a Memory Device Fault Tolerant Using a Variable Domain Redundancy Replacement Configuration", filed concurrently herewith, and assigned to the same assignee.

FIELD OF THE INVENTION

This invention generally relates to a redundancy replacement architecture for memory devices, and more particularly, to a variable domain redundancy replacement configuration applicable to memory devices.

BACKGROUND OF THE INVENTION

CMOS technology has evolved such that the computer market has rapidly opened to a wide range of consumers. Today multi-media applications require at least an 8 MB and preferably even a 16 MB memory, which increases the relative cost of the memory system within a computer. In the near future, it is likely that 32 MB and 64 MB computers will become commonplace, which suggests a potential demand for 256 Mb DRAMs (Dynamic Random Access Memory) and beyond. Still in the development stage, DRAMs in the Gigabit range are already under way, which necessitate the introduction of new techniques that guaranty the reliability of the product notwithstanding the added complexity to the design and manufacture of such memory devices. In view of the huge array size and lithographic difficulties that ensue, it is more important than ever to increase the chip yield. Process engineers are constantly attempting to reduce and ultimately, eliminate or at the very least, mask defects. Faults that inevitably remain in the chip are generally eliminated using special circuit designs, and more specifically redundancy replacement.

The present invention is a novel configuration based on the concept of domains. The domains referred in the present invention are not bound by stringent, well defined boundaries. Certain domains may be large and encompass a plurality of memory arrays; others may be small in size, and encompass only portions of a memory array. Regardless of its size, each domain is provided with a number of redundancy circuits to replace faults located within the domain. By allowing an overlap between domains, it becomes possible to repair faults in a given memory array with any of the redundancy circuits positioned within the common area of the overlapping domains, provided the fault is found in the array being serviced by the two domains. Clearly, if the number of faults exceeds the number of redundancies available in the domain (or domains) servicing that array, the scheme will fail and the memory is not repairable. However, in accordance with the present invention, if all the redundancies within a first domain have been exhausted, unused redundancies present within another domain overlapping the first one are used as a means for repairing the remaining faults that were left out unserviced within the first domain.

Domains may be tailored to any size and may be arranged in any configuration. Domains can overlap each other or stand side by side. An advantage of overlapping domains is that such an architecture allows servicing faults located in areas common to both domains with redundancy elements positioned in either one of the two domains. This advantage is particularly important because repair means available within one domain may be, at a given time, fully exhausted, and the availability of a second, overlapping domain may, thus, be advantageously used to assist the first domain to complete the repair job left undone.

Several domains may be contained within one array or, alternatively, several arrays may be contained within one domain. In this manner, a designer can take greater advantage of a given domain configuration and a choice of sizes to optimize the repairability of the design.

Conventional redundancy configurations typically employ a Fixed Domain Redundancy Replacement (FDRR) architecture, wherein redundancy elements are used to replace defective elements within a fixed size domain for each row and column redundancy.

Figure 1A:
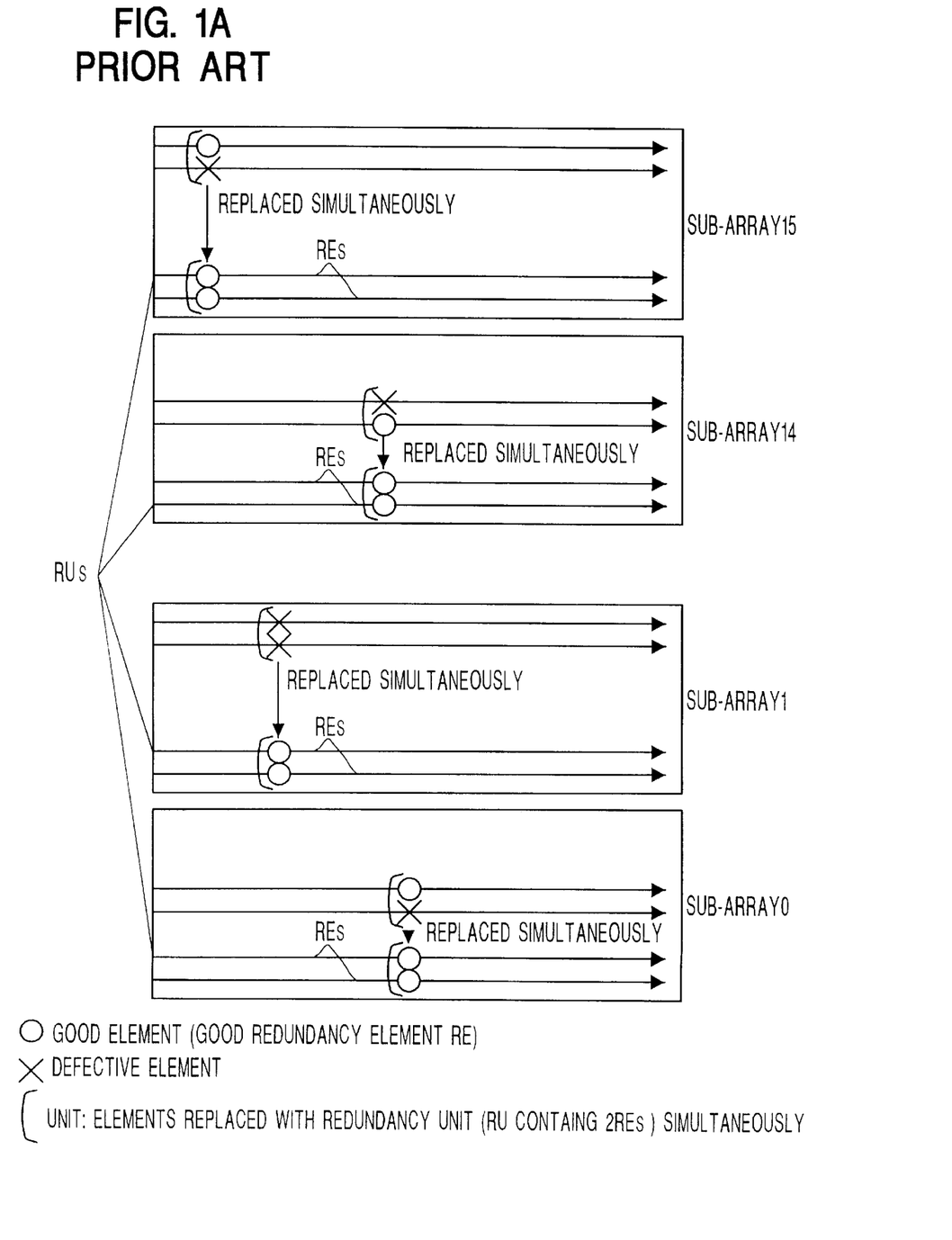
FIG. 1(a) shows a schematic representation of a memory provided with a prior art FDRR intra-block replacement scheme, and showing how failing rows in the various sections of the memory are corrected with REs replacing failing ones in each corresponding section.

Various configurations within the FDRR architecture have been successfully implemented over the years. A typical FDRR configuration, commonly used for low density DRAMs is shown in FIG. 1a. Therein are depicted a plurality of redundancy units used for replacing defective elements within the fixed size domain and which are appended to each sub-array comprising the memory. Each redundancy unit (RU) includes a plurality of redundancy elements (REs), (e.g., two RE per RU are illustrated therein), which are used to repair existing faults (labeled X) within the corresponding sub-array. This scheme, known as intra-block replacement, increases the redundancy area overhead described herein after, as the number of sub-arrays increases for high density memories, since each sub-array includes a fixed domain for the replacement, and the domains in different sub-arrays are mutually exclusive of each other. This scheme requires at least one or, preferably, two RUs in each sub-array. Thus, the efficiency of the RUs is rather poor in view of its inflexibility which reduces the chip yield substantially when faults are clustered in a given sub-array. The above-mentioned scheme is described in an article by T. Kirihata et al., entitled "A 14 ns 4 Mb DRAM with 300 mW Active Power", published in the IEEE Journal of Solid State Circuits, Vol. 27, pp. 1222–1228, September 1992.

Figure 1B:
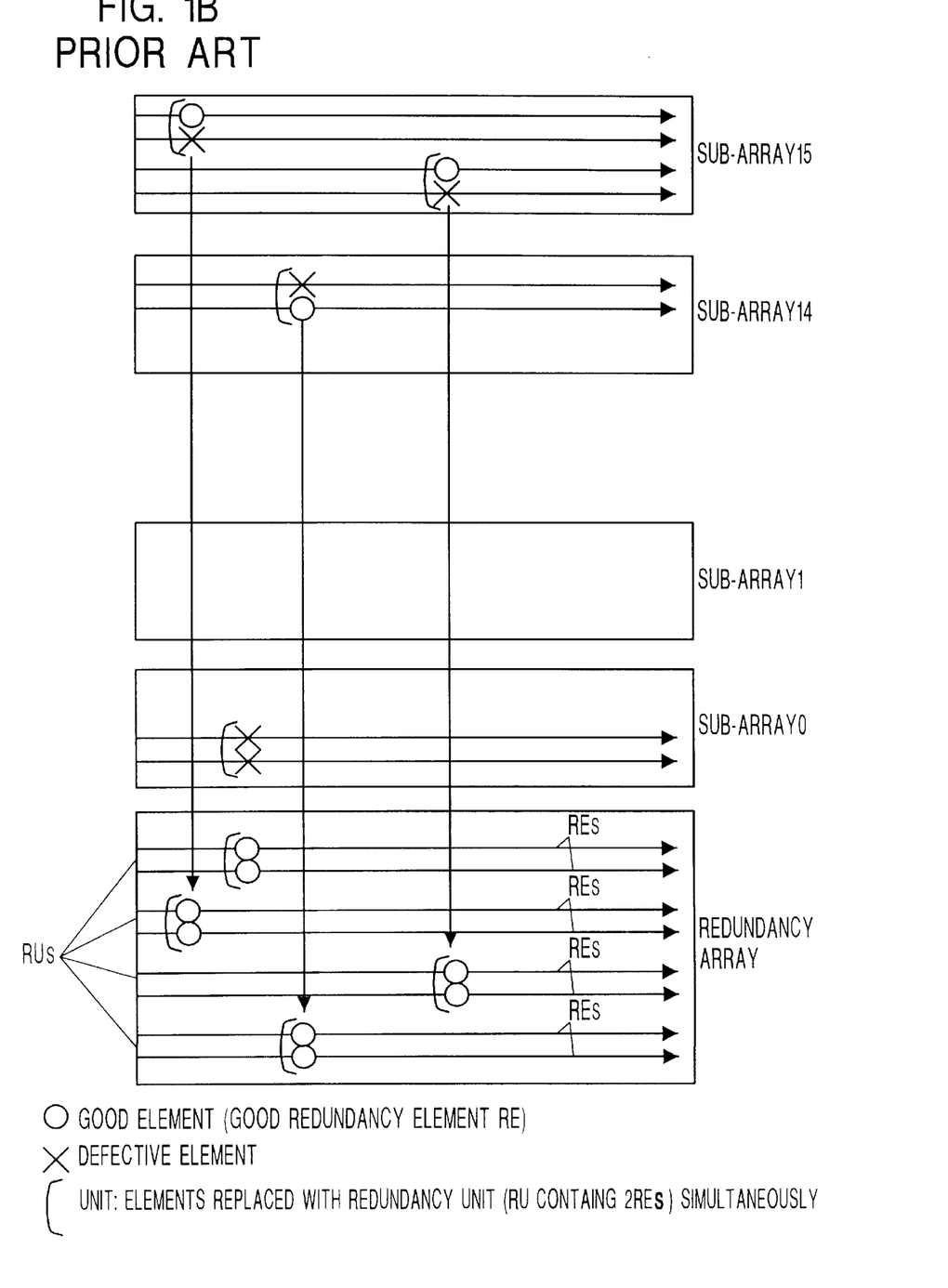
FIG. 1(b) shows a schematic diagram of a memory provided with a prior art FDRR flexible redundancy replacement scheme, wherein an array of REs clustered at one end of the memory is used to selectively replace failing rows anywhere within the memory.

Another FDRR redundancy replacement arrangement, known as a flexible redundancy replacement configuration, is shown in FIG. 1b, wherein a memory is depicted having a single redundancy array as a large fixed domain of RUs to selectively replace failing elements anywhere in the memory. In this configuration, REs within the RU can repair faults (labeled X) located in any sub-array within the memory. The advantage of this arrangement over the previously described intra-block replacement is that one section, namely, the redundancy array, having a certain number of RUs, may advantageously be used to service any number of sub-arrays forming the memory. This results in a substantial saving of area (also referred to as real estate) over the previous scheme, although it requires a substantial amount of additional control circuitry to properly service all the sub-arrays forming the memory.

More details regarding the above described configurations and the various trade-offs may be found in an article by T. Kirihata et al., "A Fault-Tolerant Design for 256 Mb DRAMs", published in the Digest of Technical Papers of the 1995 Symposium on VLSI Circuits, pp. 107–108; in an article by T. Sugibayashi et al., "A 30 ns 256 Mb DRAM with Multi-divided Array Structure", published in the IEEE Journal of Solid State Circuits, Vol. 28, pp. 1092–1098, November 1993; and in an article by H. L. Kalter et al., "A 50 ns 16Mb DRAM with a 10 ns Data Rate and On-Chip ECC", published in the IEEE Journal of Solid State Circuits, Vol. 25, pp. 1118–1128, October 1990.

In summary, a Fixed Domain Redundancy Replacement (FDRR) arrangement consists of a plurality of fixed-size domains, each of which can be independently used to replace faults contained within that domain. By expanding this concept to a chip, there may be found several domains, each having a fixed size and mutually exclusive of each other, to repair all the faults within the chip.

The FDRR architecture can be used in an intra-block replacement arrangement, wherein small domains make it possible to repair faults with minimum circuitry. However, such an arrangement is ineffective to repair clusters of faults. In the second FDRR arrangement, i.e., the flexible redundancy replacement architecture, large domains typical of such an architecture, provide good repairability of clustered faults. However, the circuit overhead is substantially increased—a significant disadvantage.

Flexible redundancy replacement is very effective in repairing a limited number of faults, especially if these faults affect bit lines, (either single bits or multiple bits); wordlines, (either single words or multiple words), and the like, all of which fall under the category of "hard faults". Yet, flexible redundancy replacement suffers from another distinct drawback in that it requires a significant number of RUs (and corresponding control circuitry) to overcome a second class of faults, known as "retention faults," in which a bit, stored in the capacitor that forms a DRAM cell, fades away over time in a weak cell, thereby producing a fault. This disadvantage is particularly troublesome because the number of retention faults far exceeds the number of hard faults.

Referring back to the hard faults within a memory, defects of this type tend to cluster. Accordingly, the intra-block replacement approach usually fails because of its poor flexibility. Hard faults are typically not too numerous, which can be ideally repaired with less RUs in a large domain. Flexible redundancy replacement is a good approach to repair hard faults, which can be serviced by a single large domain with less RUs. By way of example, if a domain contains four clustered defects, four RUs would be required to replace them in the domain. Designing four RU in each small domain with an intra-block replacement approach would require too much overhead. Even if this overhead would be acceptable, if, for instance, five clustered defects were present, the replacement of defects could potentially fail. In conclusion, increasing the domain size with the flexible redundancy approach is crucial to repair hard faults.

Retention faults, on the other hand, occur randomly throughout the memory, and their number is typically high; yet, there is a distinct advantage in that they occur randomly throughout the chip. For random faults, the intra-block replacement presents less drawbacks, because the faults are statistically distributed in many small sub-arrays. The intra-block replacement can repair a fault with less redundancy circuitry than that required for the flexible redundancy replacement. Clearly, if one RU were designed in each sub-array, with the purpose of detecting randomly occurring retention faults, then such a configuration would be ideal for detecting retention faults, provided at least one fault is present in the sub-array. Retention faults, on the other hand, are difficult to repair with a flexible redundancy replacement approach because of the large number of such faults, which frequently overwhelms the repair circuitry available in the memory device. Repairing too many faults with the flexible redundancy replacement approach is disadvantageous, because the flexibility approach requires an even greater overhead to repair such faults with the available redundancy circuitry.

In view of the foregoing, an important objective of an ideal redundancy configuration is to repair hard faults and retention faults, whether randomly distributed throughout the memory or clustered therein, without introducing an onerous burden caused by a complex redundancy area overhead. Typically, this overhead is divided into: a redundancy element overhead and redundant control circuitry overhead, both of which should be minimized to achieve good repairability and to maintain optimum performance of the memory.

Related redundancy replacement configurations, including some of the categories listed above, are described in the following references:

U.S. Pat. No. 5,491,664 to Phelan, issued Feb. 13, 1996, describes the implementation of a flexible redundancy memory block elements in a divided array architecture scheme. This configuration has both, the memory and redundancy memory blocks, coupled to a read bus to allow the redundancy memory in one memory sub-array to be shared by a second sub-array.

U.S. Pat. No. 5,475,648 to Fujiwara, issued Dec. 12, 1995, in which a memory having a redundancy configuration is described such that when an appropriate address signal agrees with the address of a defective cell, a spare cell provided by the redundant configuration is activated to replace the failing one.

U.S. Pat. No. 5,461,587 to Seung-Cheol Oh, issued Oct. 24, 1995, in which a row redundancy circuit is used in conjunction with two other spare row decoders, wherein by a judicious use of fuse boxes, signals generated by a row redundancy control circuit, make it possible to replace failing rows with spare ones.

U.S. Pat. No. 5,459,690 to Rieger at al., issued Oct. 17, 1995, describes a memory with a redundant arrangement that, in the presence of normal wordlines servicing defective memory cells, enables faulty memory cells to be replaced with redundant cells.

U.S. Pat. No. 5,430,679 to Hiltebeitel et al., issued Jul. 4, 1995, describes a fuse download system for programming decoders for redundancy purposes. The fuse sets can be dynamically assigned to the redundant decoders, allowing a multi-dimensional assignment of faulty rows/columns within the memory.

U.S. Pat. No. 5,295,101 to Stephens, Jr. et al., issued Mar. 15, 1994, describes a two level redundancy arrangement for replacing faulty sub-arrays with appropriate redundancy elements.

Whereas the prior art and previous discussions have been described mainly in terms of DRAMs,. practitioners of the art will fully appreciate that the above configurations and/or architectures are equally applicable to other types of memories, such as SRAMs, ROMs, EPROMs, EEPROMs, Flash RAMs, CAMs, and the like.

OBJECTS OF THE INVENTION

Accordingly, it is an object of the present invention to effect a fault-tolerant design applicable to any size memory.

It is another object of the invention to use a variable domain redundancy replacement arrangement (VDRR) to selectively replace failing elements with at least two variable domains, wherein portions of the domains overlap with respect to each other.

It is a further object of the invention to use redundancy units to repair a fault with at least two variable domains, wherein portions of the domain overlap with respect to each other.

It is still another object of the invention to improve the yield of a chip by dynamically repairing any size memory containing any combination of hard faults and retention faults, by selecting the most effective and efficient repair domain to eliminate faults within the memory device.

It is yet another object of the invention to simultaneously eliminate hard faults and retention faults within the memory, without curing one type of fault at the expense of the other.

It is a further object of the invention to use the variable domain redundancy replacement (VDRR) configuration to replace the conventional mutually exclusive fixed domain redundancy replacement (FDRR) configuration.

It is a more particular object of the invention to use a VDRR configuration to minimize RUs and associated circuit requirements.

It is yet a further object of the invention to ensure that repairs of hard and retention faults in a memory are achieved without expending additional power and without reducing the speed of the memory.

SUMMARY OF THE INVENTION

A primary feature of the present invention is a new and improved redundancy configuration described herein as a variable domain redundancy replacement (VDRR), allowing for the use of a more efficient and effective replacement domain out of at least two variable domains, portions of which overlap with respect to each other. The present inventors believe that VDRR eliminate drawbacks of the more conventional Fixed Domain Redundancy Replacement (FDRR) configuration that uses mutually exclusive fixed domain for the repair.

In accordance with one embodiment of the invention, a fault-tolerant memory device includes: a plurality of primary memory arrays; a plurality of domains, wherein at least portions of each of the domains are common to another domain to form an overlapped domain area, and wherein at least one of the domains overlaps portions of at least two of the primary memory arrays; a redundancy means, coupled to each of the domains, for replacing faults contained within each of the domains; control means for causing at least one of the faults within one of the domains to be replaced with the redundancy means, wherein at least one other fault of the one domain is replaced by the redundancy means coupled to another of the domains if the at least one other fault is positioned within the overlapped domain area.

In accordance to another embodiment of the invention, a fault-tolerant memory device includes: a plurality of primary memory arrays; a plurality of domains, wherein a first of the domains overlaps a portion of a second one of the domains; a redundancy means, coupled to each of the domains, for replacing faults contained within each of the domains; a control means for causing at least one of the faults within one of the domains to be replaced with the redundancy means, and wherein at least one other fault of the first domain is replaced by redundancy means coupled to the second one of the domains if the at least one other fault is positioned within a portion that is common to the first domain and second the domains.

In accordance with a third embodiment of the invention, a fault-tolerant memory device includes: a plurality of variable size domains, wherein at least portions of one of the variable size domains are common to other of the variable size domains to form an overlapped domain area; a redundancy means coupled to each of the domains for replacing faults contained within each of the domains; a control means for causing at least one of the faults within one of the domains to be replaced with the redundancy means coupled to the domain; and wherein at least one other fault of the one domain is replaced by redundancy means coupled to another of the domains if the at least one other fault is positioned within the overlapped domain area.

In accordance with a fourth embodiment of the invention, a fault-tolerant memory device includes: a plurality of variable sized non-overlapping domains; a redundancy means coupled to each of the domains for replacing faults contained within each of the domains; and a controlling means for causing at least one of the faults within one of the domains to be replaced with the redundancy means coupled to the domain.

In accordance with a fifth embodiment of the invention, a fault-tolerant memory device includes: memory arrays; domains having at least portions of each of the domains common to another domain to form an overlapped domain area and at least one of the domains overlapping portions of at least two of the primary arrays; repair means, coupled to each of the domains, for repairing faults contained within each of the domains; and repair means for repairing at least one of the faults within one of the domains with the repair means coupled to the domain, wherein at least one other fault of the one domain is repaired by the repair means coupled to another of the domains, if the at least one other fault is positioned within the overlapped domain area.

BRIEF DESCRIPTION OF THE DRAWINGS

The above-mentioned objects, aspects and advantages of this invention and the manner of attaining them will become more apparent and the invention itself will be further described by reference to the following detailed description of embodiments of the invention taken in conjunction with the accompanying drawings, the description of which follows.

FIG. 5(b) is a timing diagram applicable to the VDRR configuration shown in FIG. 5a.

FIG. 6(b) is the timing diagram applicable to the block diagram of FIG. 6a.

FIG. 7(b) is the timing diagram applicable to the arrangement of FIG. 7a.

DETAILED DESCRIPTION OF THE PREFERRED EMBODIMENTS

Variable Domain Redundancy Replacement (VDRR) is a statistical approach that reduces the redundancy overhead, while maintaining good repairability. When n faults are randomly distributed throughout m domains, a probability P of finding x faults in a given domain is determined by the following Bernoulli's distribution:

$$P = {}_nC_x \cdot (1/m)^x \cdot \left(1 - \frac{1}{m}\right)^{n-x} \qquad (1)$$

Figure 2A:
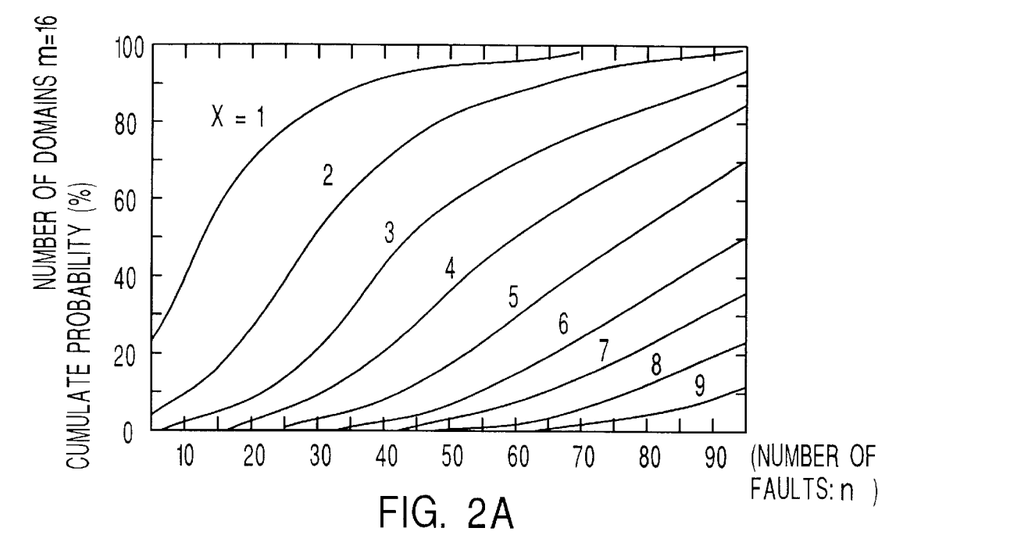
FIGS. 2a–2b show a cumulative fault probability $\Sigma P$ to find at least x faults in a domain with respect to the total numbers of faults and domains, n and m, respectively.
Figure 2B:
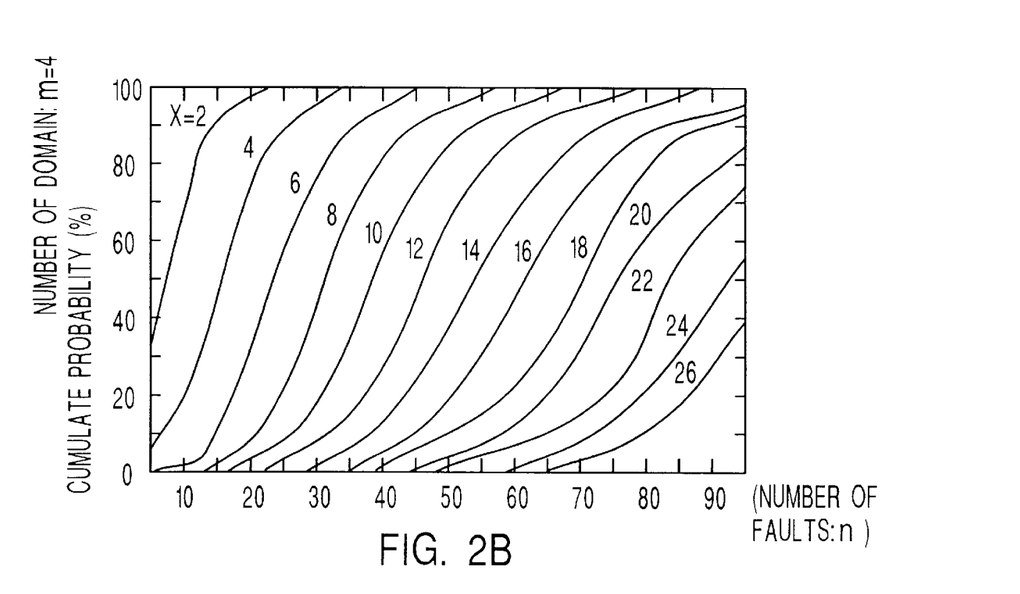

FIGS. 2a–2b show the cumulative fault probability $\Sigma P$ within a given domain with respect to n and x, for m=16 and m=4, respectively.

Figure 2C:
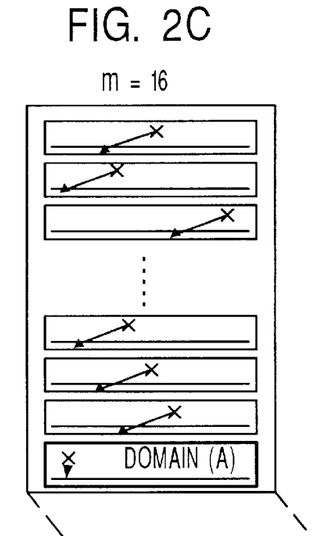
FIGS. 2c–2e illustrate a schematic diagram of a memory array respectively serviced by domains A, B, and C, in accordance with a preferred embodiment of the present invention.
Figure 2D:
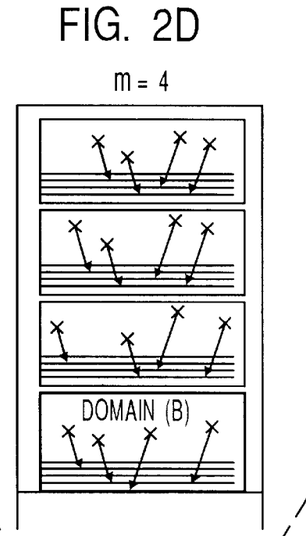
Figure 2E:
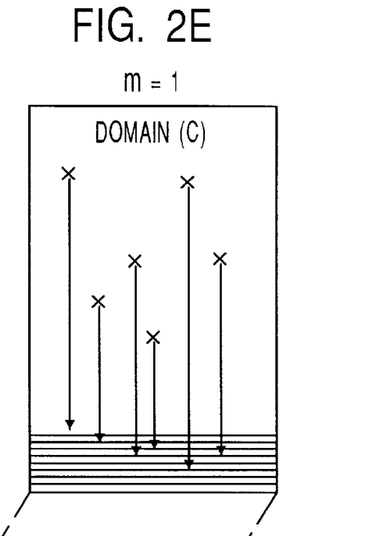

FIGS. 2c–2e illustrate the physical configurations for domain A (m=16) in FIG. 2c, domain B (m=4) in FIG. 2d, and domain C (m=1) in FIG. 2e, respectively. When 64 faults are randomly distributed in 16 domains, the probability of zero faults in domain A (m=16) is negligibly small ($^{18}2\%$). Each of the (A) domains has probably at least one fault. The probability of less than eight faults in a larger domain, e.g., (B) (m=4) is, likewise, also quite small ($^{18}1\%$). The present inventors have surmised that 32 faults out of 64 can effectively be repaired by combining variable domains (A) and (B), which have 1 and 4 redundancy elements (REs), respectively. The remaining 32 faults out of 64 can be repaired using a full flexible redundancy replacement in the domain (C) (m=1). Thus, one may create domains contained within larger domains, which in turn may be part of yet larger domains, to provide the necessary redundancy units and/or elements which are lacking in each of the smaller domains. In addition to the advantage of repairing randomly distributed faults, the VDRR approach can advantageously cure retention faults as well as hard faults, and can achieve these results with lesser redundancy overhead than the Fixed Domain Redundancy Replacement (FDRR). As previously discussed in the background of the present invention, retention faults are usually randomly distributed over sub-arrays and can effectively be repaired with a small domain (A). Hard faults, on the other hand, tend to cluster in a given sub-array; however, hard-faults are not as numerous, and are best handled by a larger domain, e.g., (C). Variable domains (A), (B), and (C) overlap; this overlap permits choosing a best possible repair domain depending on the type and size of the fault.

Figure 3:
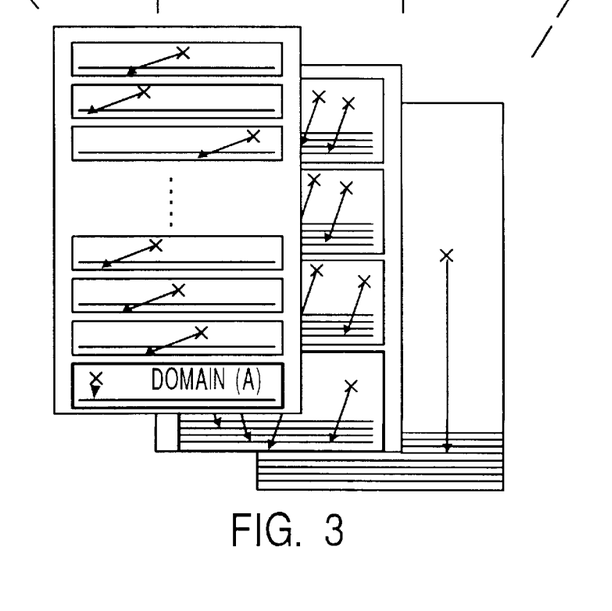
FIG. 3 is a schematic diagram of three domains A, B, and C shown in FIGS. 2c–2e, superimposed on top of one another, in accordance with the preferred embodiment of the present invention.

The three variable domains (A), (B), and (C) referred to in FIGS. 2c–2e are shown separated from one another to better explain the cumulative fault probability of finding a fault in a given domain given by Bernoulli's equation. In practice, however, all three domains are superimposed on top of one another, as depicted in FIG. 3. An overlap permits using a redundancy circuit in one domain to cure a fault in another domain, provided the fault is common to both domains.

Figure 4A:
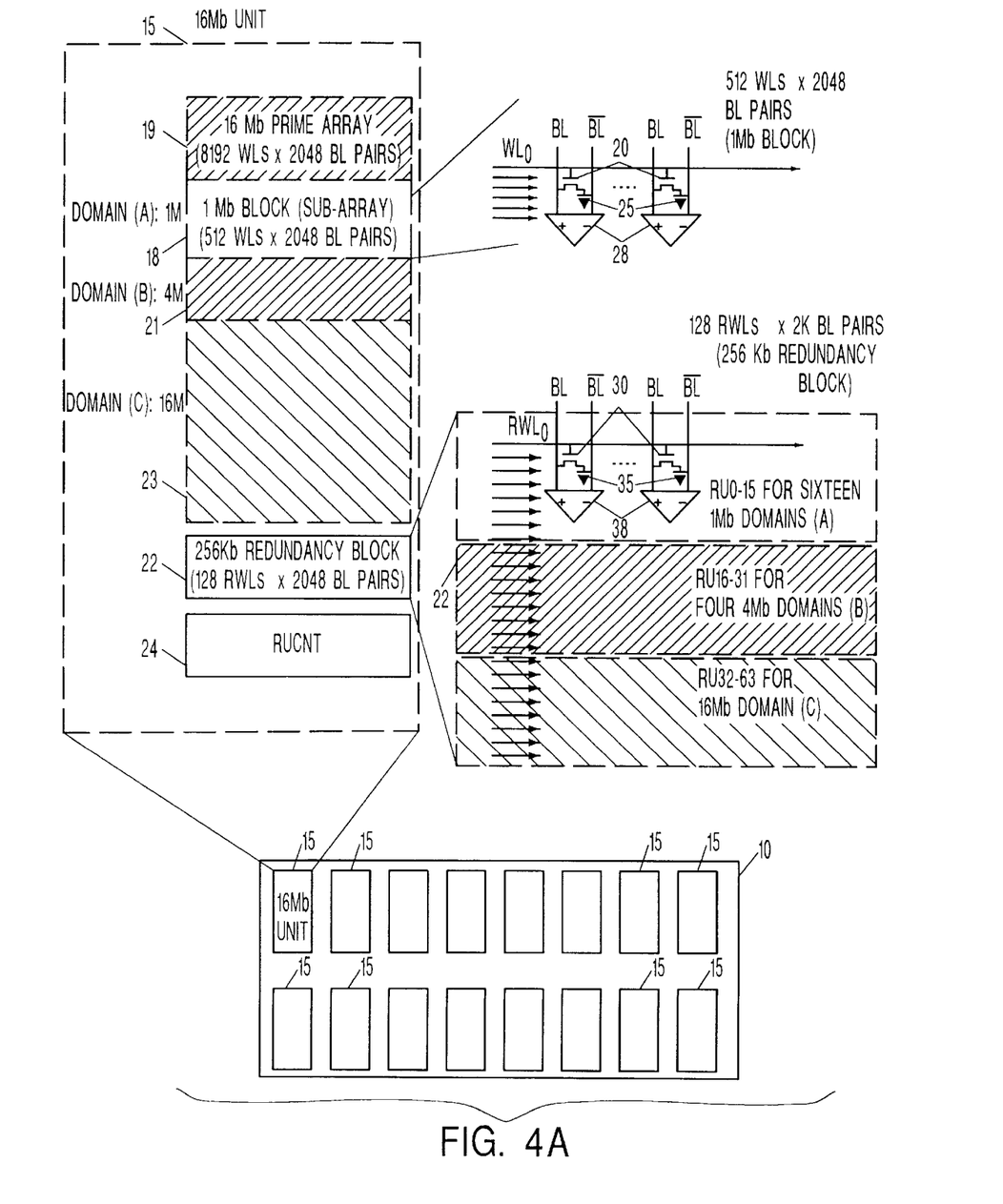
FIG. 4(a) is a schematic diagram showing how the VDRR configuration is applied to a 256 Mb DRAM.

Referring now to FIG. 4(a), there is shown a 256 Mb DRAM architecture provided with a VDRR configuration. The 256 Mb DRAM chip 10 includes sixteen 16 Mb primary arrays 15. Each unit 15 consists of an array block 19, a 256 kb redundancy block 22, and redundancy control circuits RUCNTs 24, to be described hereinafter. The 16 Mb primary array 19, having 8,192 (16×512 per 1 Mb block) wordlines (WL), includes sixteen 1 Mb blocks (sub-arrays), each having 1 M cells. To the left in FIG. 4(a) are shown three domains A, B, and C spanning across the primary 16 Mb array 19. (A), the smallest domain, referenced by numeral 18, consists of a 1 Mb sub-array. (B), the next domain in size, referenced by numeral 21, consists of a 4 Mb sub-array, and is shown as having (A) fully contained within its boundaries. Finally, the domain (C), referenced by numeral 23, spans across the entire 16 Mb primary array 19, and encompasses both domains (A) 18 and (B) 21.

To the upper right in FIG. 4(a) are shown two cells forming part of the memory array, wherein each cell includes an NMOS device 20 and a capacitor 25. To each wordline WL are coupled the gates of 2,048 NMOS devices 20. There are 512 WLs present in the 1 Mb block (i.e., 512 WLs×2,048 cells), but only one is selected when a particular 1 Mb (out of 16) block is activated. (Note: only one WL out of the 8,192 WLs is active in the 16 Mb array). The capacitive charge stored in the capacitor 25 is transferred to the corresponding bitline BL. A sense amplifier 28 amplifies the charge on the bitline BL. The amplified bit information (i.e., the data) is selected by the corresponding column address (not shown), and is transferred to a data output circuit (not shown).

In lieu of designing redundant wordlines (RWLs) in each 1 Mb block, a 256K redundancy block including 128 RWLs is utilized for each 16 Mb primary array 19. The redundancy block 22 includes 64 RUs. For purposes of illustration, each RU includes two RWLS. Unlike the intra-block replacement with 16 fixed 1 Mb domains or the flexible redundancy replacement with a single fixed 16 Mb domain, the 64 RUs are assigned to the three variable domains (A) 1 Mb 18, (B) 4 Mb 21, and (C) 16 Mb 23. Each of 16 RUs (RU0–15) is associated with one 1 Mb domain (A) (m=16), 16 other RUs (RU16–31) are used in the 4 Mb domain (B) (m=4), and the remaining 32 RUs (RU32–63) are associated with the entire 16 Mb replacement domain (C) (m=1). The three domains (A), (B), and (C) are designed to overlap over each other. This overlap allows selecting a most effective and efficient domain, depending on the fault type, thereby increasing the repairability of the unit in the presence of hard faults and of retention faults.

Figure 4B:
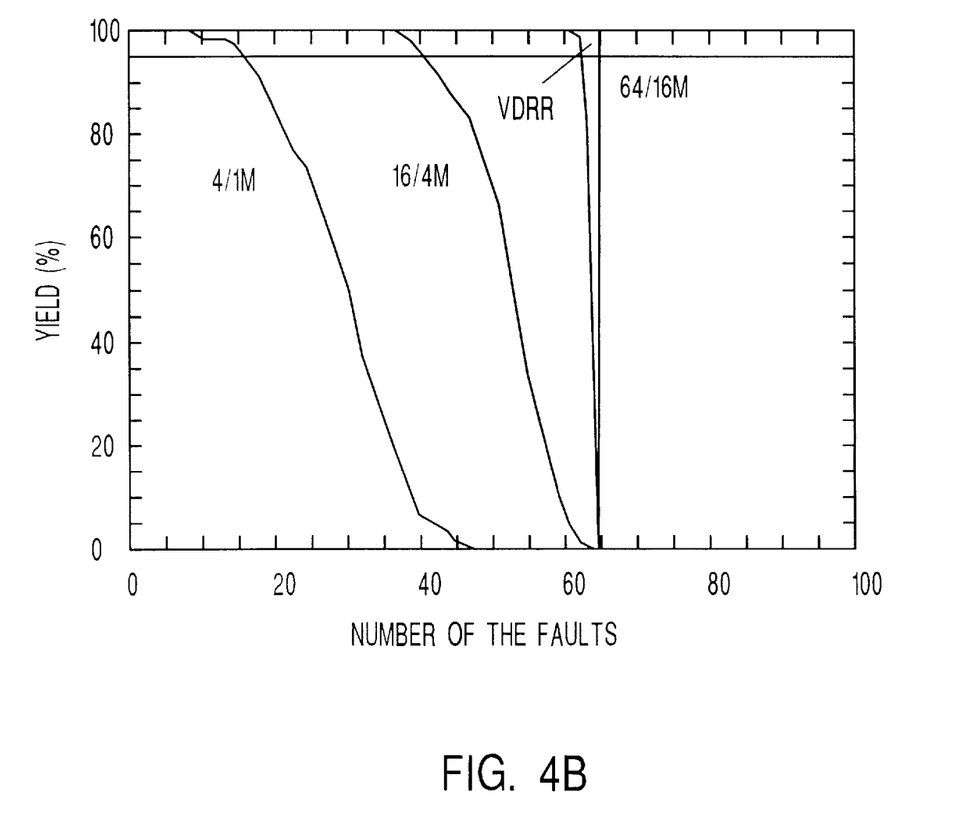
FIG. 4(b) shows a simulated repairability in a FDRR with intra-block replacement 4 RUs in a 1 Mb domain, followed by the repairability in a FDRR intra-block replacement of 16 RUs in a 4 Mb domain; an FDRR with flexible replacement of 64 RUs in a 64 Mb domain; and a VDRR with Variable Domains (A) 1 RU in a 1 Mb domain, (B) 4 RUs in a 4 Mb domain, and (C) 32 RUs in a 16 Mb domain.

FIG. 4(b) shows the simulated yield for the 16 Mb primary array 19 with respect to the number of randomly distributed faults n in three instances: 4 RUs for each 1 Mb domain (4/1M), 16 RUs for each 4 M domain (16/4M), 64 RUs for a 16M domain (64/16M) and VDDR for the combination of ((A) 1/1M+(B) 4/4M+(C) 32/16M). Note that the total number of elements per 16 Mb array is the same for all cases. VDRR allows a repairability to a degree essentially equivalent to that obtainable through the flexible domain redundancy replacement scheme (64 RUs in a 16 Mb domain).

TABLE I shown below is a comparison of the number of fuses, which is an important parameter to measure the redundancy overhead, relative to the intra-block replacement 4/1M and the repairable number of faults to allow a 95% yield. The redundancy combination of 4/1M, 16/4M and 64/16M assumes the presence of independently controllable 4, 16, and 64 redundant units for 1M, 4M and 16M, respectively.

TABLE I

| Redundancy | 4/1M | 16/4M | 64/16M | VDDR |
|---|---|---|---|---|
| Additional # of fuses | 0 | 128 | 256 | 160 |
| Repairable # of faults | 16 | 40 | 64 | 62 |

TABLE 1 illustrates how the repairability of a memory array increases with domain size; however, more fuses are required.

In the VDRR configuration, some of the RUs that are assigned to small domains can be effectively used, since the probability is high that faults will be present in each domain. The smaller domain for these RUs reduces the overall number of fuses required. Consequently, VDRR allows a repairability to a degree essentially equivalent to that obtainable through the flexible domain redundancy replacement scheme (64/16M), while using 96 less fuses.

The advantage of the VDRR could be further enhanced if some of the faults would be clustered. This is because, according to the present invention, the domain (C) can effectively repair the clustering faults, while randomly distributed faults can be repaired more effectively with the domains (A) and (B).

Referring back to the example of FIG. 4(a), by enabling the redundancy unit control circuit RUCNT 24, all the 8,192 WLs in the primary 16 Mb array 19 are disabled. One out of the 128 RWLs (redundant WL) in the 256 Kb redundancy block 22 is activated. The operation of the redundancy combination comprising NMOS devices 20, capacitors 25, and sense amplifiers 28 described previously also applies to the combination comprised of devices 30, capacitors 35 and sense amplifiers 38. The detailed operation of the control circuitry is described next.

The wordlines in the sixteen 1 Mb blocks and the RWLs in the redundant block 22 are controlled by the respective Redundancy Unit Control circuit (RUCNT) 24, which will be explained in more detail with reference to FIG. 5(a). For better performance, these circuits are most advantageously physically positioned below the redundancy block 22 (i.e., at the bottom end of unit 15).

Figure 5A:
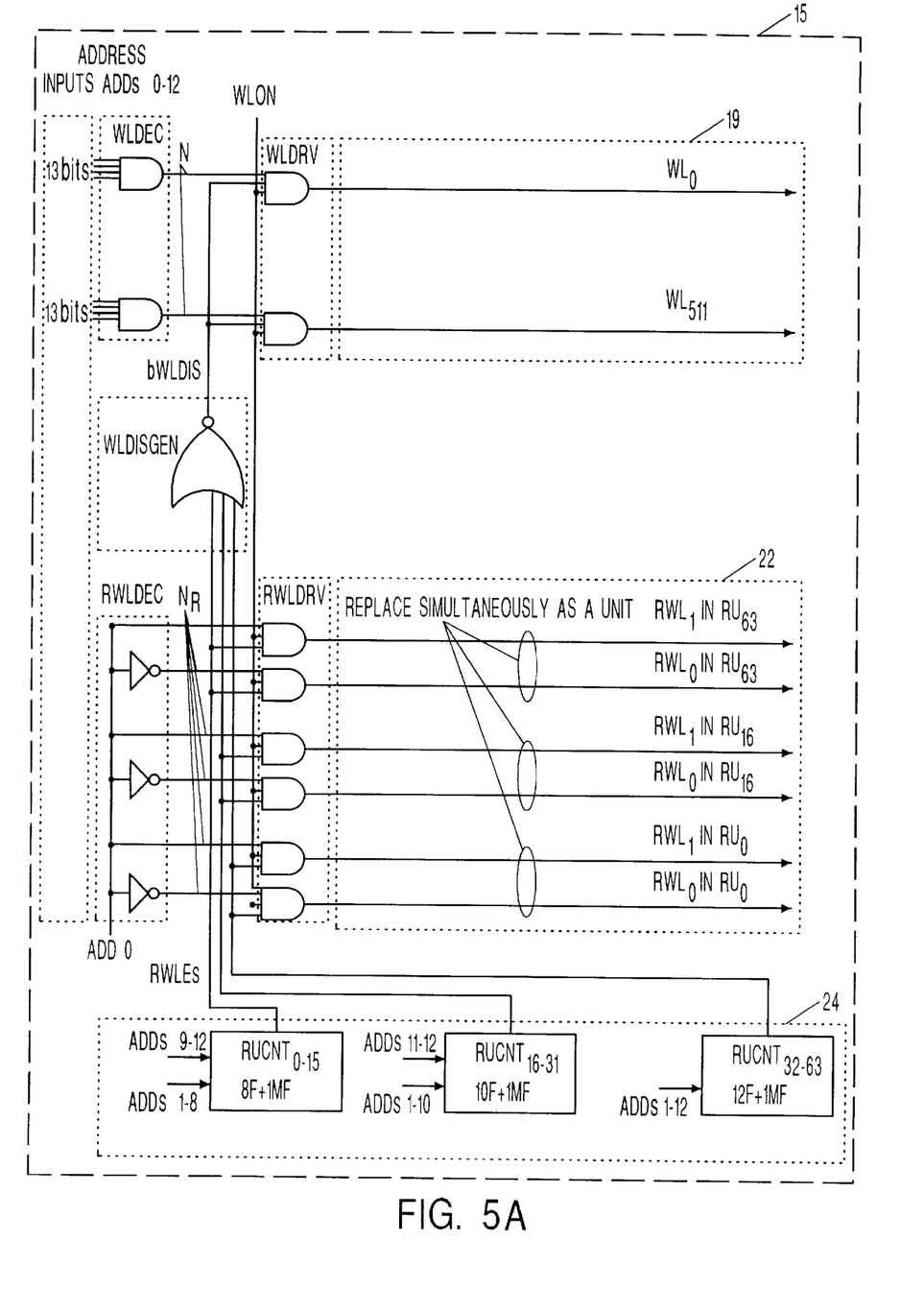
FIG. 5(a) shows a control circuit applicable to the VDRR configuration, according to the present invention.

FIG. 5(a) shows a schematic block representation of a variable domain redundancy control circuitry. The control circuitry contained within the unit 15 includes wordline decoders (WLDEC); redundancy wordline decoders (RWLDEC); Redundancy Unit Control circuit (RUCNT), represented as RUCNT0–15, each having 8 address fuses and 1 master fuse, for Domain (A), RUCNT16–31, each having 10 address fuses and 1 master fuse, for Domain (B), RUCNT32–63, each having 12 address fuses and 1 master fuse, for Domain (C); wordline driver (WLDRV); redundancy wordline driver (RWLDRV); and wordline disable generator (WLDISGEN), all suitably interconnected as shown. To illustrate the operation of the VDRR configuration of the present invention, let it be presumed that either, a WL (out of 8,192 WLs in the 16 Mb primary array 19) or a RWL (out of 128 in the redundancy block 22), is active in the 16 Mb prime array 19 (FIG. 4a). Practitioners of the art will readily appreciate that two or more WLs may become active within the 16 Mb unit 15, at the expense of only minor modifications of the circuitry shown in FIG. 5a.

The detailed operations of 1) a standby mode, 2) a normal active mode, and 3) a variable redundancy active mode, are described hereinafter.

Figure 5B:
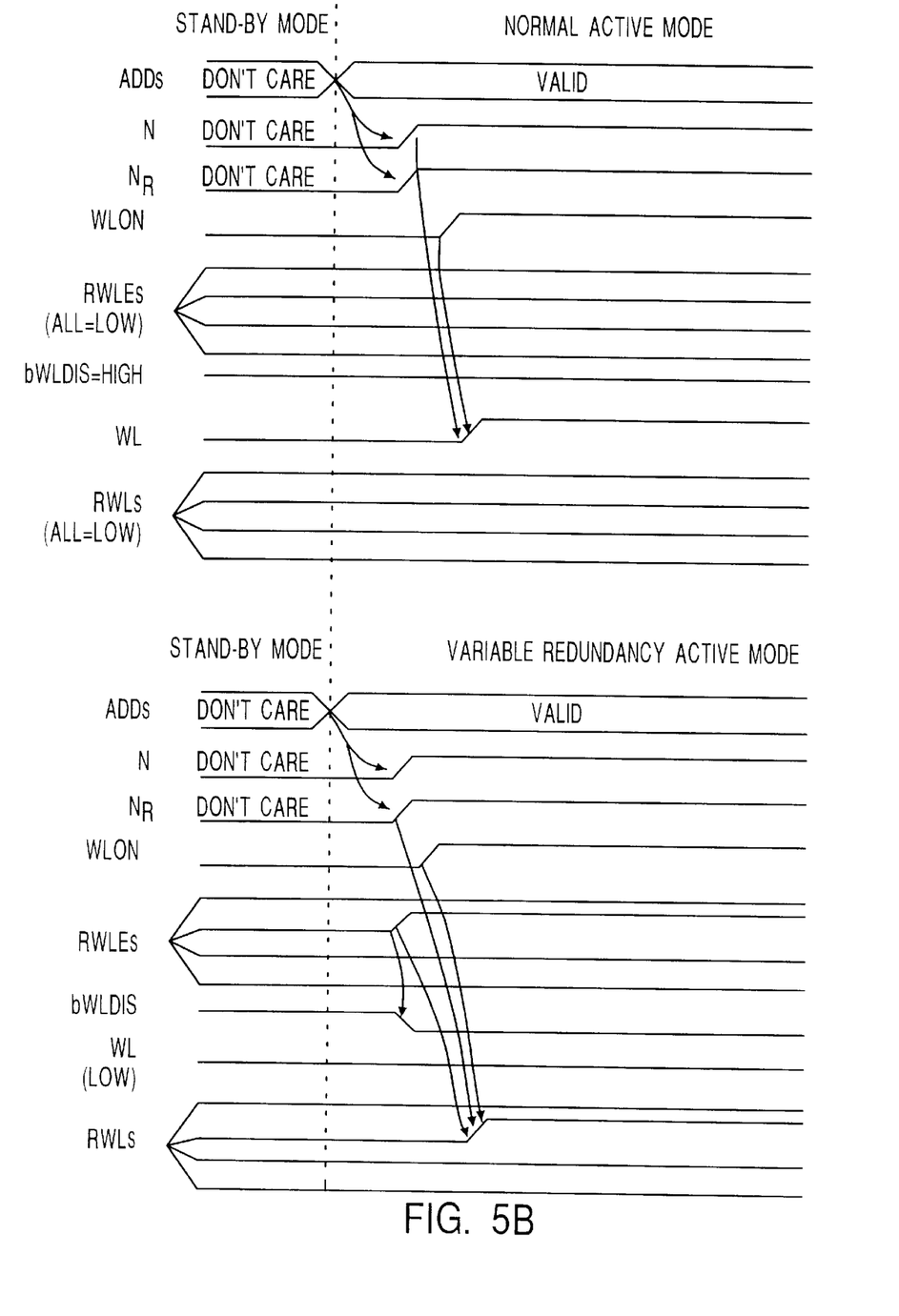

FIG. 5b shows the timing diagrams for the most relevant signals on the line/nodes having correspondingly identical names: address ADDs, node N, node NR, control line WLON, WL disable signal bWDIS, RWLEs, WL, and RWL, referred to in FIG. 5a.

1) While in the word standby mode (i.e., when the chip is not enabled), the control line signal WLON remains at a low (i.e., at 0), which disables all the WLs and RWLs (all at 0), regardless of the state (i.e., "DON'T CARE" condition) of the WLDEC output signal N, of the RWLDEC output signal NR, and of the RUCNT output signals RWLEs. When the chip is enabled (i.e., in the active mode), either WL or RWL is active (but not both). When WL is enabled (i.e., at a 1), the chip enters the so-called normal active mode. Alternatively, when RWL is activated (which disables WL), the chip is referred to as being in the variable redundancy active mode.

2) While in the normal active mode, all the redundant word lines enable signals RWLEs remain at a low, keeping the output signal (bWLDIS) of the wordline disable generator circuit WLDISGEN at a high (i.e., at a 1). The detailed operation of the circuit 24 for generating the RWLE signal will be described hereinafter. When the 16 Mb prime array 19 (FIGS. 4(a) and 5(a)) is enabled, 13 bits address information is transferred to WLDEC, enabling one node N out of 8,192; this makes it possible to activate one WL out of the 8,192 WLs when the signal WLON switches to a high.

3) While in the variable redundancy active mode, activating the redundant wordlines RWLs is controlled by a two-path decoding: a) through RUCNT and b) through RWLDEC. As previously explained, a RU including two RWLs is controlled by the respective RUCNT. Each RE contained in the RU is controlled by the alternate path b), i.e., RWLDEC. Both decoding paths work in parallel, and a final decoding of the results of RUCNT and RWLDEC takes effect in the RWLDRV. A detailed description of the operation of the present invention while in the variable redundancy active mode is described next.

The variable redundancy active mode is typically detected by RUCNT, which activates the respective RWLE prior to the arrival of a signal on the control line WLON. (The detection phase is referred to as the redundancy match detection phase). This detection forces the signal bWLDIS at the output of WLDISGEN to switch to 0, thereby inhibiting the wordlines in the 16 Mb prime array from becoming active. During the RUCNT redundancy match detection phase, an alternate path for selecting an RE in at least one RU is decoded in RWLDEC. Concurrently, the respective RWLDEC is activated with address information, switching the corresponding NR to a 1.

As previously discussed, it is assumed that two WLs are simultaneously replaced with two RWLS, as an RU in each domain. The 1 Mb Domain (A) includes 512 WLs, two of which are supported by RUCNT0–15. Each RUCNT0–15, therefore, requires eight address fuses and one master fuse to decode two out of 512 WLs in each 1 Mb Domain (A). Only one out of the sixteen RUCNT0–15 is activated, when the corresponding one out of the sixteen 1 Mb Domains (A) is selected. Addresses 9–12 determine the corresponding one out of sixteen Domains (A) in the 16 Mb unit. Each RUCNT16–31 controlling 4 Mb Domain (B) requires 10 address fuses and 1 master fuse to decode 2 out of 2048 WLs in each 4 Mb Domain (B). Four out of sixteen RUCNT16–31, which are assigned to the same 4 Mb domain (B), are simultaneously activated, when the corresponding Domain (B) is selected. Addresses 11–12 determine the corresponding one out of four 4 Mb Domain (B) in the 16 Mb unit. Each RUCNT32–63 controlling 16 Mb Domain (C) requires 12 address fuses and 1 master fuse to decode 2 out of 8096 WLs. RUCNT32–63 are always activated without using any address, because Domain (C) serves whole of the 16 Mb unit. Except for the number of address fuses and the address decoding, the RUCNT0–63 are identical circuit.

Address ADD0 is used for decoding 1 out of 2 RWLs in the corresponding RU. This 1 b decoding is enabled in RWLDEC regardless of Domains (A), (B), and (C). This path is independently controlled no matter if it is in a redundancy mode or in a normal mode. The final decision to activate an RWL is determined by the decoding result of NR and RWLE in RWLDRV. The aforementioned two path decoding: Path 1, wherein RUCNT activates RU, and Path 2, wherein RWLDEC decodes one out of two RWLs per RU, making it possible for one RWL to become active (without incurring in speed penalties) by means of appropriate addressing, which had already been previously decoded when WLON switched to a high.

Figure 6A:
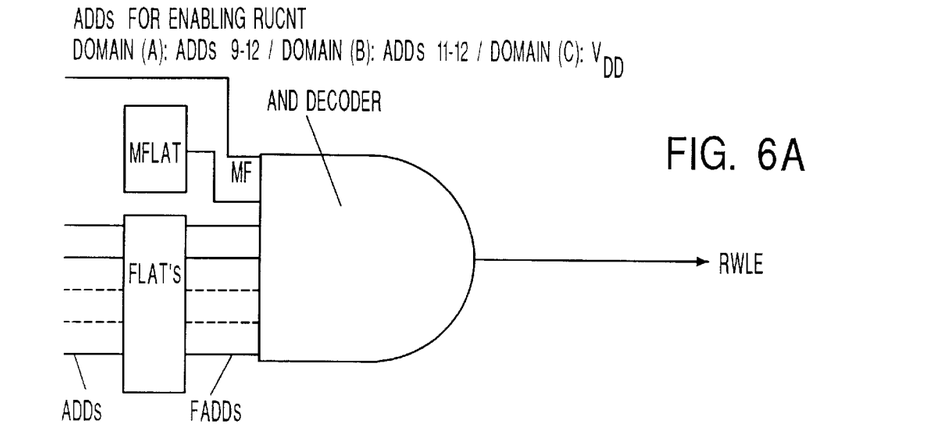
FIG. 6(a) is a schematic block diagram of a redundancy unit control circuit, according to the present invention.
Figure 6B:
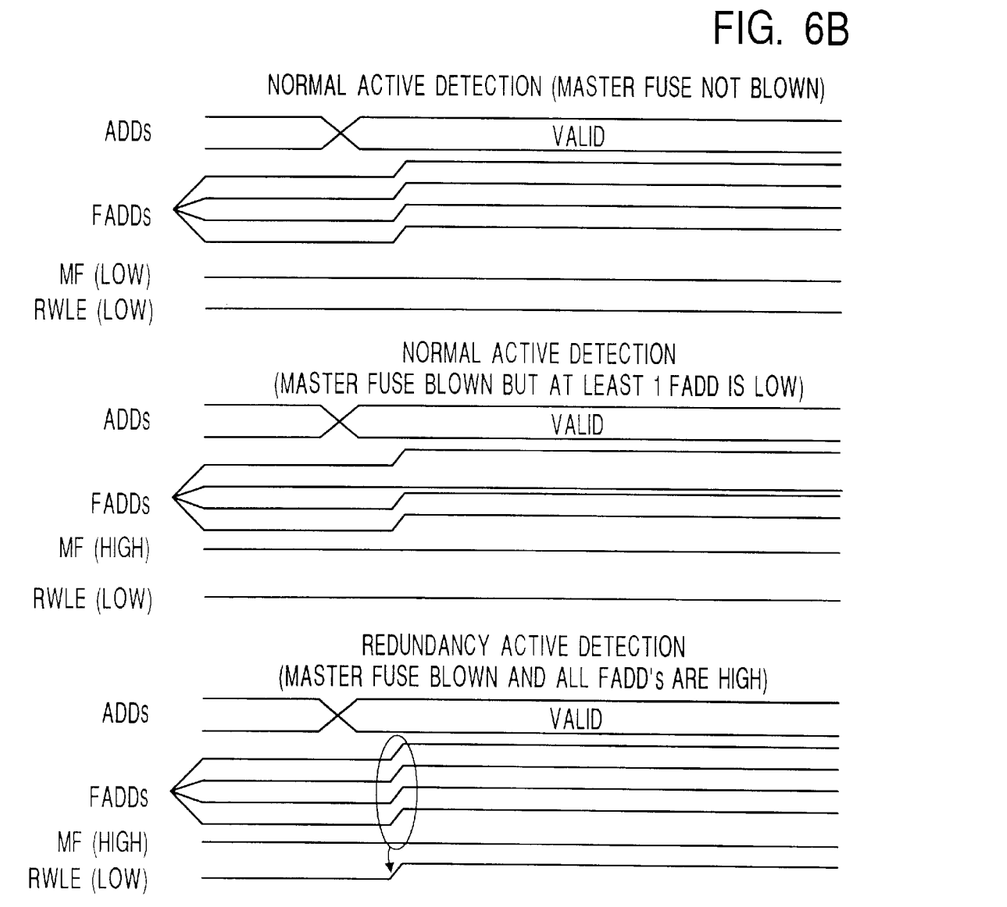

FIGS. 6a and 6b, respectively show a block diagram and the timing diagram of a single RU control circuit RUCNT. This circuit is provided with a plurality of fuse latches FLATs driving a decoder (i.e., an AND gate). The only difference between a conventional Fixed Domain Redundancy Replacement (FDRR) control circuit and the VDRR control circuit RUCNT resides in the number of address fuses that are required for each domain. Additionally, one master fuse MFLAT is also needed for each RUCNT. RUCNT is only activated when the domain is selected, which is enabled by the corresponding addresses, depending on the domain configuration, as described previously.

The master fuse needs to be blown in order to enable a RUCNT. As long as the master fuse remains intact, the output MF of MFLAT (FIG. 6b) stays at 0. The output RWLE of the AND gate, therefore, remains at 0, regardless of the address. When the master fuse is blown (MF set at 1) and the RUCNT is activated by the corresponding address bits, RWLE is controlled by the combination of outputs of FLAT, i.e., FADD. FADD switches to 0 when the corresponding address input ADD fails to match the programmed fuse information. Alternatively, FADD switches to 1 when the corresponding ADD matches the programmed fuse information. Only when all the fuse programmed addresses match the ADD inputs, and MF is blown, forcing RWLE to switch to 1.

Figure 7A:
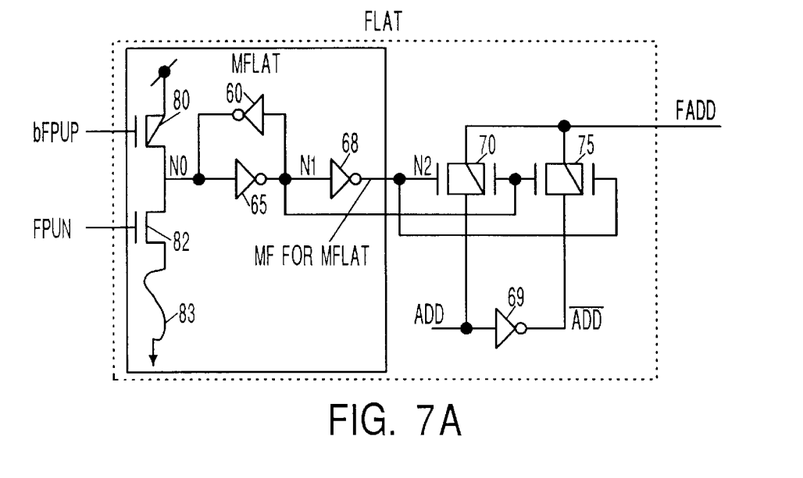
FIG. 7(a) depicts an address fuse latch arrangement FLAT and a master fuse latch arrangement MFLAT controlled by the circuitry shown in FIGS. 5a and 6a, for replacing faulty elements in the memory.
Figure 7B:
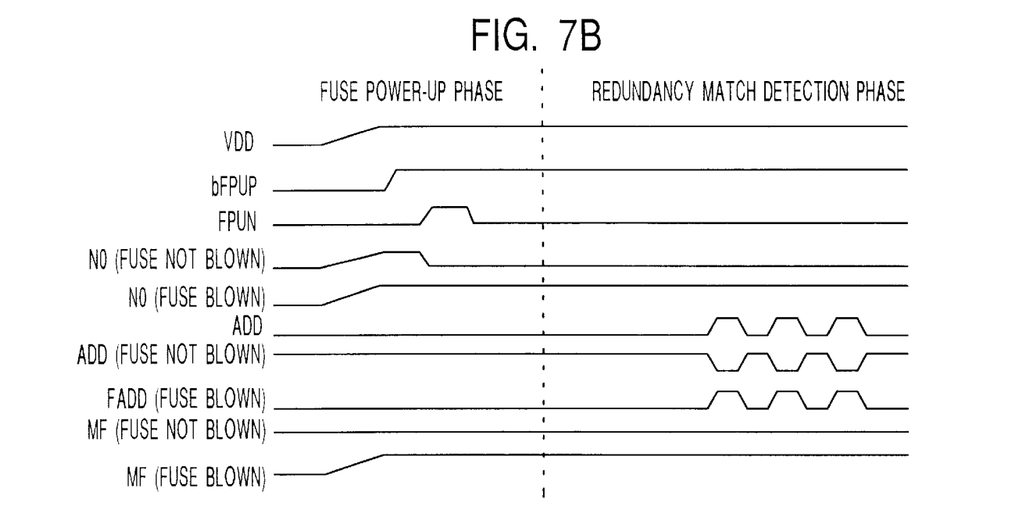

Referring now to FIG. 7a, there is shown a schematic diagram for the fuse latch FLAT, wherein FLAT is depicted as an address-fuse comparator. A CMOS latch, formed by 60, 65 and 68, is set by devices 80 and 82 during the power-up phase of the chip by FPUP and FPUN, as shown in the diagram of FIG. 7b. If fuse 83 is not blown at power-up, nodes N0, N1, and N2 are set to 0, 1 and 0, respectively. Alternatively, if fuse 83 is blown, nodes N0, N1 and N2 are set to 1, 0, and 1, respectively. The particular states of nodes N0, N1 and N2 are latched in CMOS latch circuits 60, 65 and 68. Either of the CMOS transfer gates 70 and 75 opens up, depending on the state of nodes N1 and N2. ADD and $\overline{ADD}$ (inverted by circuit 69) are coupled to the CMOS transfer gates 70 and 75, respectively. As long as the fuse remains intact (i.e., at 0), the output FADD of FLAT 47 follows $\overline{ADD}$. When the fuse is blown, FADD follows ADD. FADD switches to 1 when both ADD and the fuse are either 0 or 1, resulting in an address and fuse match detection.

Within circuit FLAT (FIG. 7a) is included the circuit MFLAT (or Master FLAT), which is shown alongside with appropriate timing curves (FIG. 7b). The CMOS latch, formed by 60, 65 and 68, is set during the power-up phase of the chip by FPUP and FPUN, as depicted in the diagram. If, during power-up, fuse 83 is not blown, then N0, N1 and N2 (also referred to as MF) switch to 0, 1, 0, respectively. With MF at 0, the AND gate within RUCNT (FIG. 6a) is disabled. If, on the other hand, fuse 83 is blown, then, at power-up, N0, N1 and N2 (also referred to as MF) switch to 1, 0, 1, respectively, while MF is at 1, which enables the AND gate in RUCNT (FIG. 6).

The present invention described herein may be designed in many different memory configuration schemes. While the present invention has been described in terms of a preferred embodiment, other embodiments may come to mind to those skilled in the art without departing from the spirit and scope of the present invention. The invention should then be measured in terms of the claims that follow.

What is claimed is:

1. A fault-tolerant memory device provided with a variable domain replacement arrangement, the memory device comprising:

primary memory arrays;

domains having portions common to another domain to form an overlapped domain area, and wherein at least one of said domains overlaps portions of at least two of said primary arrays;

redundancy means, coupled to each of said domains, for replacing faults contained within each of said domains; and control means for causing at least one of said faults within one of said domains to be replaced with said redundancy means coupled to said one domain, wherein at least one other fault of said one domain is replaced by said redundancy means coupled to another of said domains, if said at least one other fault is positioned within said overlapped domain area.

2. The fault-tolerant memory device of claim 1, wherein said memory device is selected from the group consisting of a DRAM, SRAM, ROM, EPROM, EEPROM, Flash RAM, and CAM.

3. The fault-tolerant memory device of claim 1, wherein said redundancy means are controlled by a redundancy control circuit.

4. The fault-tolerant memory device of claim 3, wherein said redundancy control circuit further comprises:

a master fuse latch comprising a master fuse, said master fuse being coupled to a comparator; and a plurality of fuse latches having each a plurality of fuses and comparators, said fuse latches being controlled by address lines, wherein said fuse latches are respectively coupled to gating means, and said gating means generates a signal that enables a redundancy wordline driver and a wordline disable circuit.

5. The fault-tolerant memory device of claim 1, wherein said control means further comprises:

at least one wordline coupled to a wordline driver, said wordline driver being controlled by a wordline disable circuit;

at least one wordline decoder coupled to said at least one wordline driver, said coupling being provided by an address line;

at least one redundancy wordline coupled to a redundancy wordline driver;

at least one redundancy wordline decoder coupled to at least one redundancy wordline driver, said coupling being provided by an address line, said at least one redundancy wordline driver being controlled by one of said redundancy wordline decoders; and at least one variable domain redundancy control circuit for enabling said redundancy wordline drivers, and for enabling said wordline disable circuit, which in turn inhibits a corresponding one of said wordlines.

6. The fault-tolerant memory device of claim 5, wherein said redundancy wordline drivers respectively control a plurality of redundancy wordlines, and wherein said wordline drivers respectively control a plurality of said wordlines.

7. The fault-tolerant memory device of claim 5, wherein said wordline disable circuit is controlled by said at least one redundancy control circuit.

8. The fault-tolerant memory device of claim 5, wherein said at least one redundancy control circuit is an AND gate.

9. A fault-tolerant memory device comprising:

primary memory arrays having each a plurality of memory elements;

variable domain redundancy units having each a plurality of redundancy elements, wherein at least one of said variable domain redundancy units are coupled to each of said primary memory arrays; and control means for causing defective elements in each of said primary memory arrays to be replaced with said redundancy units.

10. A fault-tolerant memory device provided with a variable domain replacement arrangement, the memory device comprising:

primary memory arrays;

domains having at least two of said domains contained within each of said arrays;

redundancy means coupled to each of said domains for replacing faults contained within each of said domains; and control means for causing at least one of said faults within one of said domains to be replaced with said redundancy means coupled to said domain.

11. A fault-tolerant memory device provided with a variable domain replacement arrangement, the memory device comprising:

a plurality of domains;

primary memory arrays having at least one of said domains extend over at least one of said primary memory arrays, wherein at least portions of each of said domains are common to another domain to form an overlapped domain area;

redundancy means coupled to each of said domains for replacing faults contained within each of said domains; and control means for causing at least one of said faults within one of said domains to be replaced with said redundancy means coupled to said domain, wherein at least one other fault of said one domain is replaced by said redundancy means coupled to another of said domains, if said at least one other fault is positioned within said overlapped domain area.

12. A fault-tolerant memory device provided with a variable domain replacement arrangement, the memory device comprising:

primary memory arrays;

domains having a first one of said domains overlap a portion of a second one of said domains;

redundancy means coupled to each of said domains for replacing faults contained within each of said domains; and control means for causing at least one of said faults within one of said domains to be replaced with said redundancy means coupled to said domain, wherein at least one other fault of said first domain is replaced by said redundancy means coupled to said second one of said domains, if said at least one other fault is positioned within a portion that is common to said first domain and second said domains.

13. A fault-tolerant memory device provided with a variable domain replacement arrangement, the memory device comprising:

variable size domains having portions of one of said variable size domains common to another of said variable size domains to form an overlapped domain area;

redundancy means, coupled to each of said domains, for replacing faults contained within each of said domains; and control means for causing at least one of said faults within one of said domains be replaced with said redundancy means coupled to said domain, wherein at least one other fault of said one domain is replaced by said redundancy means coupled to another of said domains if said at least one other fault is positioned within said overlapped domain area.

14. A fault-tolerant memory device provided with a variable domain replacement arrangement, the memory device comprising:

variable sized non-overlapping domains;

redundancy means, coupled to each of said domains, for replacing faults contained within each of said domains; and control means for causing at least one of said faults within one of said domains to be replaced with said redundancy means coupled to said domain.

15. A fault-tolerant memory device provided with a variable domain replacement arrangement, the memory device comprising:

primary memory arrays;

domains contained within one of said primary memory arrays, wherein at least portions of each of said domains are common to another domain to form an overlapped domain area, and wherein at least one of said domains overlaps portions of at least two of said primary arrays;

redundancy means, coupled to each of said domains, for replacing faults contained within each of said domains; and control means for causing at least one of said faults within one of said domains to be replaced with said redundancy means coupled to said domain, wherein at least one other fault of said one domain is replaced by said redundancy means coupled to another of said domains, if said at least one other fault is positioned within said overlapped domain area.

16. A fault-tolerant memory device provided with a variable domain replacement arrangement, the memory device comprising:

a plurality of domains;

primary memory arrays having a first one of said domains extend over portions of at least two of said primary memory arrays, and at least a second one of said domains being fully contained within one of said primary arrays, wherein at least portions of said first and second domains are common to each other to form an overlapped domain area;

redundancy means, coupled to each of said domains, for replacing faults contained within each of said domains; and control means for causing at least one of said faults within one of said domains to be replaced with said redundancy means coupled to said domain, wherein at least one other fault of said one domain is replaced by said redundancy means coupled to another of said domains, if said at least one other fault is positioned within said overlapped domain area.

17. A fault-tolerant memory device provided with a variable domain replacement arrangement, the memory device comprising:

primary memory arrays;

variable size domains having at least one of said domains fully contained in another of said domains to form an overlapped domain area;

redundancy means, coupled to each of said domains, for replacing faults contained within each of said domains; and control means for causing at least one of said faults within one of said domains to be replaced with said redundancy means coupled to said domain, wherein at least one other fault of said overlapping domains are replaced by said redundancy means coupled to another of said domains.

18. A memory device provided with a variable domain repair arrangement, the memory device comprising:

primary memory arrays;

domains having at least portions of each of said domains common to another domain to form an overlapped domain area, and at least one of said domains overlapping portions of at least two of said primary arrays;

repair means, coupled to each of said domains, for repairing faults contained within each of said domains; and repair means for repairing at least one of said faults within one of said domains with said repair means coupled to said domain, wherein at least one other fault of said one domain is repaired by said repair means coupled to another of said domains, if said at least one other fault is positioned within said overlapped domain area.

19. A memory device provided with a variable domain repair arrangement, the memory device comprising:

primary memory arrays;

a plurality of domains, wherein at least two said domains are contained within each of said arrays;

repair means, coupled to each of said domains, for repairing faults contained within each of said domains;

control means for causing at least one of said faults within one of said domains to be repaired with said repair means coupled to said domain.

20. A memory device provided with a variable domain repair arrangement, the memory device comprising:

a plurality of domains;

primary memory arrays having one of said domains extend over at least one of said primary memory arrays, and at least portions of each of said domains common to another domain form an overlapped domain area;

repair means, coupled to each of said domains, for repairing faults contained within each of said domains; and control means for causing at least one of said faults within one of said domains to be repaired with said repair means coupled to said domain, wherein at least one other fault of said one domain is repaired by said repair means coupled to another of said domains, if said at least one other fault is positioned within said overlapped domain area.

21. A memory device provided with a variable domain repair arrangement, the memory device comprising:

primary memory arrays;

a plurality of domains, wherein a first of said domains overlaps a portion of a second one of said domains;

repair means, coupled to each of said domains, for repairing faults contained within each of said domains; and control means for causing at least one of said faults within one of said domains to be repaired with said repair means coupled to said domain, wherein at least one other fault of said first domain is repaired by said repair means coupled to said second one of said domains, if said at least one other fault is positioned within a portion that is common to said first domain and second said domains.

22. A memory device provided with a variable domain repair arrangement, the memory device comprising:

variable size domains having at least portions of one of said variable size domains common to another of said variable size domains to form an overlapped domain area;

repair means, coupled to each of said domains, for repairing faults contained within each of said domains;

control means for causing at least one of said faults within one of said domains to be repaired with said repair means coupled to said domain, wherein at least one other fault of said one domain is repaired by said repair means coupled to another of said domains if said at least one other fault is positioned within said overlapped domain area.

23. A memory device provided with a variable domain repair arrangement, the memory device comprising:

variable sized non-overlapping domains;

repair means, coupled to each of said domains, for repairing faults contained within each of said domains; and control means for causing at least one of said faults within one of said domains to be repaired with said repair means coupled to said domain.

24. A memory device provided with a variable domain repair arrangement, the memory device comprising:

primary memory arrays;

domains contained within one of said primary memory arrays having at least portions of each of said domains common to another domain to form an overlapped domain area, and at least one of said domains overlap portions of at least two of said primary arrays;

repair means, coupled to each of said domains, for repairing faults contained within each of said domains; and control means for causing at least one of said faults within one of said domains to be repaired with said repair means coupled to said domain, wherein at least one other fault of said one domain is repaired by said repair means coupled to another of said domains, if said at least one other fault is positioned within said overlapped domain area.

25. A memory device provided with a variable domain repair arrangement, the memory device comprising:

a plurality of domains;

primary memory arrays having a first one of said domains extend over portions of at least two of said primary memory arrays, at least a second of said domains is fully contained within one of said primary arrays, and at least portions of said first and second domains are common to each other to form an overlapped domain area;

repair means, coupled to each of said domains, for repairing faults contained within each of said domains; and control means for causing at least one of said faults within one of said domains to be repaired with said repair means coupled to said domain, wherein at least one other fault of said one domain is repaired by said repair means coupled to another of said domains, if said at least one other fault is positioned within said overlapped domain area.

26. A memory device provided with a variable domain repair arrangement, the memory device comprising:

primary memory arrays;

variable size domains having at least one of said domains to be fully contained in another of said domains to form an overlapped domain area;

repair means, coupled to each of said domains, for repairing faults contained within each of said domains; and control means for causing at least one of said faults within one of said domains to be replaced with said repair means coupled to said domain, wherein at least one other fault of said overlapping domains are repaired by said repair means coupled to another of said domains.

* * * * *